United States Patent [19]

Sato et al.

[11] 4,407,627

[45] Oct. 4, 1983

[54] AUTOMATIC WAFER ORIENTING APPARATUS

[75] Inventors: Hiroshi Sato; Kei Takatsu; Junji Isohata, all of Tokyo, Japan

[73] Assignee: Canon Kabushiki Kaisha, Tokyo, Japan

[21] Appl. No.: 256,173

[22] Filed: Apr. 21, 1981

Related U.S. Application Data

[63] Continuation of Ser. No. 970,146, Dec. 18, 1978, abandoned.

[30] Foreign Application Priority Data

Dec. 20, 1977 [JP] Japan .................................. 52-154171

[51] Int. Cl.³ ............................................. B65G 47/24
[52] U.S. Cl. .................................... 414/757; 198/394; 414/754; 414/787
[58] Field of Search ............... 414/754, 757, 780, 781, 414/787; 406/87; 198/394

[56] References Cited

U.S. PATENT DOCUMENTS

| | | | |
|---|---|---|---|
| 3,297,134 | 1/1967 | Pastuszak | 198/394 X |
| 3,820,647 | 6/1974 | Waugh et al. | 414/757 X |
| 3,865,254 | 2/1975 | Johannsmeier | 198/394 X |
| 3,982,627 | 9/1976 | Isohata | 406/87 X |
| 4,179,110 | 12/1979 | Kosugi et al. | 270/58 |

OTHER PUBLICATIONS

Wafer Centering Fixture; IBM Technical Disclosure Bulletin, vol. 14, No. 4; Sep. 1971.
Wafer Angular Alignment Detection and Positioning System; IBM Technical Disclosure Bulletin, vol. 14, No. 11; Apr. 1972.

*Primary Examiner*—Leslie J. Paperner
*Attorney, Agent, or Firm*—Fitzpatrick, Cella, Harper & Scinto

[57] ABSTRACT

An automatic wafer orienting apparatus comprising a first orienting device for driving and rotating a wafer thereby orienting the wafer while utilizing a peripheral edge and an orientation cut thereof as the guide, a device for disengaging the thus oriented wafer from the first wafer orienting device, and a second wafer orienting device for re-orienting the wafer by pressing a lateral edge and an orientation cut thereof against orienting members provided on a wafer chuck.

1 Claim, 4 Drawing Figures

AUTOMATIC WAFER ORIENTING APPARATUS

This is a continuation of application Ser. No. 970,146, filed Dec. 18, 1978, now abandoned.

BACKGROUND OF THE INVENTION

1. Field of the Invention

The present invention relates to an automatic wafer orienting apparatus.

2. Description of the Prior Art

In the manufacture of semiconductor elements it is generally necessary, in plural steps, to exactly register the pattern on a wafer with the pattern of a photomask (mask registration) for pattern printing.

Such mask registration has been achieved manually by observation of the wafer pattern and the photomask pattern under a microscope, but in recent years various automatic mask registration methods utilizing photoelectric detection are coming into use.

In a manual mask registration, the registration of the mask can be achieved if a registration pattern on the wafer is properly positioned in the viewing field of the microscope, and the precision of registration is generally within $\pm 150$ $\mu$m in consideration of the general dimension of the viewing field of the microscope. For orienting a wafer within said precision of registration there is already disclosed, in the U.S. Pat. No. 3,982,627, a wafer orienting apparatus for driving and rotating a wafer thereby orienting the wafer while utilizing a lateral edge and an orientation cut thereof as the guide.

In an automatic mask registration wherein the registration is achieved by photoelectric detection signals from a wafer pattern and a photomask pattern, it is generally necessary to use special automatic alignment marks which have to be incorporated in the wafer, thus wasting a certain number of semiconductor elements.

The size of such automatic alignment mark, or namely the number of semiconductor elements to be wasted, can be represented as a function of the precision of wafer registration, and can be reduced as the precision is improved.

Also in case of preparing a photomask with a repeater, the reticle has to be exchanged for incorporating the automatic alignment marks in place of the semiconductor element patterns, and the eventual position error between said patterns and the automatic alignment marks resulting from such reticle exchange is an important cause for error in automatic registration.

As explained in the foregoing, a size reduction of the automatic alignment mark will improve the yield of semiconductor elements in a given area of the wafer, and it will be rendered possible to dispense with the reticle exchange and to significantly improve the precision of automatic registration if the automatic alignment marks can be made smaller so as to be incorporated in each semiconductor chip.

For these reasons the size reduction of the automatic alignment marks is being raised as a major target in the manufacture of the semiconductor elements.

In various automatic registration methods already proposed, the wafer is generally subjected to a pre-alignment or pre-orientation with a peripheral edge and an orientation cut thereof as the guide, and then is subjected to an automatic mask registration by means of a photoelectric detecting mechanism which is designed to have a coverage corresponding to the precision of said pre-alignment and which detects the positional aberration between the automatic alignment marks of the wafer and the photomask to control the wafer or the photomask by the detection signal. Consequently an improvement in the precision of pre-alignment allows reduction of the coverage of the photodetection and the size of the automatic alignment marks.

In the prior art technology, the pre-alignment is for example achieved by driving a peripheral edge of the wafer with a drive roller to rotate said wafer and to disengage the drive roller when the orientation cut of the wafer is brought to a determined position, or by providing, in addition to the above-mentioned drive roller, another drive roller rotating in an opposite direction whereby the rotating force of said rollers to the wafer becomes balanced when the orientation cut of the wafer becomes simultaneously engaged with said two rollers.

In such pre-alignment methods it has been impossible to stably achieve a pre-alignment precision not exceeding $\pm 10$ $\mu$m since the pre-alignment is performed by stopping the wafer in a rotational movement by means of the orientation cut thereof.

Also such known aligning apparatus, requiring a considerable mechanism, cannot be mounted directly on the wafer chuck but is generally provided outside thereof. Consequently, in order to obtain an elevated pre-alignment precision within $\pm 10$ $\mu$m, it is required to realize and maintain a positional precision of several micrometers between the wafer chuck and the alignment apparatus positioned outside said wafer chuck which is repeatedly displaced for printing operations. Because of such difficulties the precision of pre-alignment in the prior art has remained in a range of $\pm 150$ $\mu$m.

SUMMARY OF THE INVENTION

The object of the present invention is to provide an automatic wafer orienting apparatus capable of automatically orienting the wafer on the wafer chuck with an elevated precision. The above-mentioned object is achieved according to the present invention by driving and rotating a wafer with first orienting means provided outside the wafer chuck for orienting the wafer while utilizing a peripheral edge and an orientation cut thereof as a guide, and subsequently pressing said wafer again against orienting members provided on the wafer chuck.

The apparatus of the present invention not only improves the precision of automatic mask registration and the yield of semiconductor elements in the manufacture thereof, but also facilitates significantly the positioning of the wafer pattern with respect to a test machine or a scriber within a precision of $\pm 20$ $\mu$m $\sim \pm 30$ $\mu$m as required in the ensuing test or scribe step, since the wafer pattern is already positioned with an elevated precision to the lateral edge and the orientation cut of the wafer, thus greatly contributing to the improvement of productivity.

DESCRIPTION OF THE PREFERRED EMBODIMENTS

Figure 1:
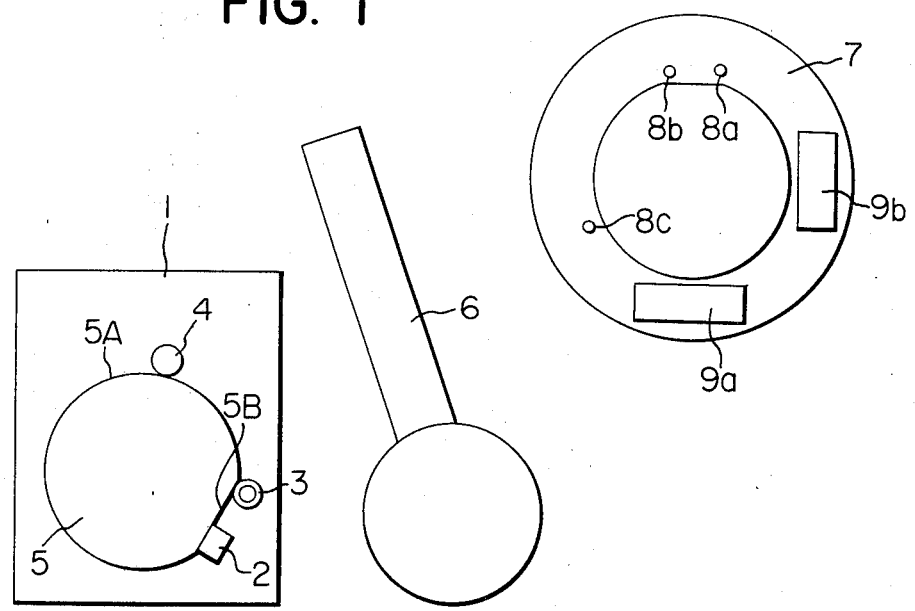
FIG. 1 is a schematic view showing a first embodiment of the present invention.

In a first embodiment of the automatic wafer orienting apparatus of the present invention shown in FIG. 1, first orienting means is composed of an engaging member 2, a drive roller 3 functioning as drive means and an orienting roller 4 functioning as orienting means, all mounted on a support plate 1. A wafer 5 supplied thereto is rotated anticlockwise by friction drive by drive roller 3 engaging the peripheral edge of the wafer, and is oriented while the peripheral edge 5A and the orientation cut 5B of the wafer are utilized as the guide. The details of the above-mentioned first orienting means are already disclosed in the U.S. Pat. No. 3,982,627 of the present applicant and are therefore not repeated in the present text.

A precision of pre-alignment of approximately ±150 μm can be achieved by the above-mentioned first orienting means.

Upon completion of said first orientation, the wafer 5 is disengaged, by means of an automatic hand 6, from the first orienting means and is brought to and positioned on a wafer chuck 7, which is provided thereon with three alignment members 8a, 8b and 8c in positions respectively corresponding to the engaging member 2, drive roller 3 and orienting roller 4 of the first orienting means.

Figure 2:
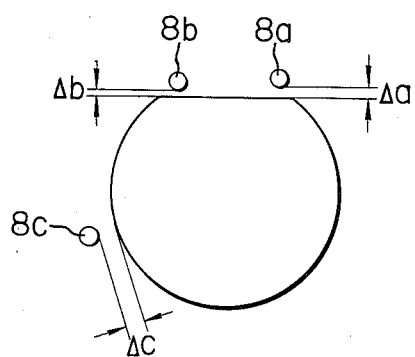
FIG. 2 is a schematic view showing the orienting method by a second orienting means shown in FIG. 1.

FIG. 2 shows the state of the wafer transferred to and positioned on the wafer chuck 7, wherein the gaps Δa, Δb and Δc respectively between the orienting members 8a, 8b and 8c and thus positioned wafer are selected smaller than 150μ, which is the orienting precision obtainable with said first orienting means.

In FIG. 1 there are also shown press members 9a and 9b constituting second orienting means.

Upon positioning of the wafer on the wafer chuck 7, said press member 9a provided on a line perpendicular to a line connecting the centers of said orienting members 8a, 8b presses the wafer toward the central point of said line connecting the centers of said orienting members 8a, 8b, whereby the orientation cut 5B of said wafer is pressed against either one of the orienting members having a smaller gap Δa or Δb. Thereafter the wafer is rotated about said contacting orienting member until the other orienting member comes into contact with said orientation cut 5B. While said orientation cut 5B is maintained in contact with the orienting members 8a and 8b, the press member 9b presses the wafer in a direction parallel to the orientation cut 5B, whereby the wafer 5 displaces horizontally while maintaining said contact until the wafer is pressed against the orienting member 8c to complete the second orientation. The above-mentioned orienting members 8a, 8b and 8c and the press members 9a and 9b are composed of a material of a very low friction coefficient. In this manner it is rendered to achieve an orienting precision of approximately ±10 μm.

Figure 3:
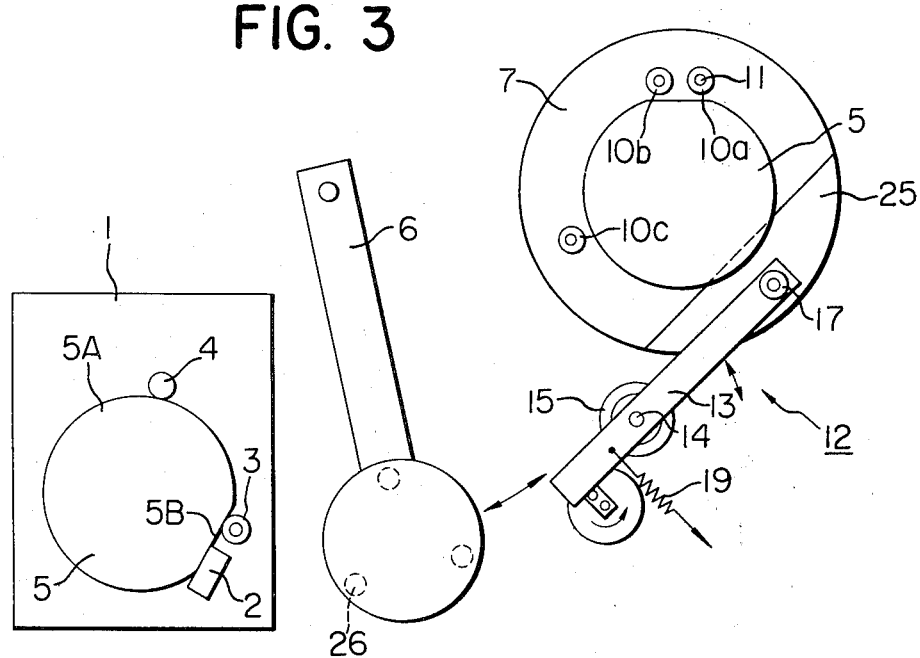
FIG. 3 is a schematic view showing a second embodiment of the present invention.
Figure 4:
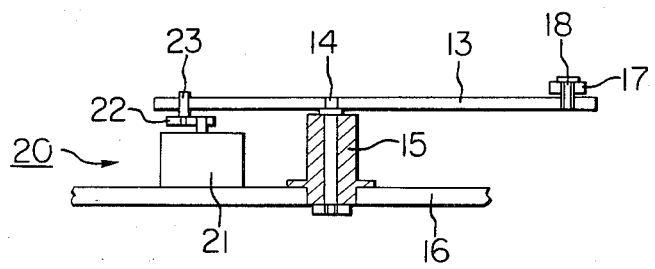
FIG. 4 is a schematic view showing a pressing arm shown in FIG. 3.

FIGS. 3 and 4 show a second embodiment of the present invention which is similar to the foregoing first embodiment but employs a single press member on the wafer chuck. Corresponding to the pins 8a, 8b and 8c shown in FIG. 1 there are provided orienting ball bearings 10a, 10b and 10c having a center of rotation 11. 12 is a press mechanism for pressing a wafer toward the ball bearings 10. Also there is provided a press arm 13 pivotable about a shaft 14 which is mounted, as shown in FIG. 4, on a support plate 16 by means of a bearing 15. Said arm is provided, on the upper face at the front end thereof, with a ball bearings 17 for pressing the wafer, fixed with a screw 18, and also is provided at the rear end thereof with a spring 19 for constantly biasing said arm toward the wafer. Said rear end engages, as shown in FIG. 4, with an arm control member 20 which is composed of a motor 21, an eccentric arm 22 and a pin 23 affixed thereto to control the movement of said arm when the motor 21 is rotated in the direction of arrow. When the wafer is brought onto the wafer chuck 7 by means of a suction pad 26 provided on the arm 6, the motor 7 is synchronizedly rotated to cause rotation of the arm 13 in the anticlockwise direction whereby said arm 13 enters a notched portion 25 of the wafer chuck. In this manner the wafer 5 is pressed by the ball bearing 17 against the orienting ball bearings 10 and thus oriented with an elevated precision.

As detailedly explained in the foregoing, the apparatus of the present invention allows an alignment precision of approximately ±10 μm by performing a second re-orientation after a first orientation assuring a precision of approximately ±150 μm, and thus is extremely useful for achieving the orientation of the wafer.

What we claim is:

1. An automatic wafer orienting apparatus for orienting a wafer with respect to a wafer chuck prior to alignment with a mask, comprising:

a first automatic wafer orienting sub-apparatus comprising:

a support plate for supporting a wafer having an orientation cut in a part of the peripheral edge thereof; and wafer position defining members comprising a drive member contacting the peripheral edge of the wafer for rotating said wafer on said support plate and defining members for contacting the peripheral edge of the wafer;

a transport device for transporting the wafer oriented in said first automatic wafer orienting sub-apparatus to a second automatic wafer orienting sub-apparatus; and a second automatic wafer orienting sub-apparatus comprising:

a wafer chuck;

positioning members provided on said wafer chuck; and means for pressing the thus transported wafer against said positioning members.

* * * * *